(12) United States Patent
Beukes et al.

(10) Patent No.: US 12,240,761 B2
(45) Date of Patent: Mar. 4, 2025

(54) DEVICE FOR LARGE-SCALE PRODUCTION OF GRAPHENE

(71) Applicant: CealTech AS, Stavanger (NO)

(72) Inventors: Jon Are Beukes, Stavanger (NO); Fan Huang, Stavanger (NO)

(73) Assignee: CealTech AS, Stavanger (NO)

( * ) Notice: Subject to any disclaimer, the term of this patent is extended or adjusted under 35 U.S.C. 154(b) by 170 days.

(21) Appl. No.: 17/759,560

(22) PCT Filed: Feb. 1, 2021

(86) PCT No.: PCT/EP2021/052291
§ 371 (c)(1),
(2) Date: Jul. 27, 2022

(87) PCT Pub. No.: WO2021/156196
PCT Pub. Date: Aug. 12, 2021

(65) Prior Publication Data
US 2023/0102041 A1    Mar. 30, 2023

(30) Foreign Application Priority Data
Feb. 3, 2020 (SE) .................................. 2050110-2

(51) Int. Cl.
*C01B 32/186* (2017.01)
*C01B 32/194* (2017.01)
(Continued)

(52) U.S. Cl.
CPC .......... *C01B 32/186* (2017.08); *C01B 32/194* (2017.08); *C23C 16/01* (2013.01);
(Continued)

(58) Field of Classification Search
CPC .................................................. C01B 32/186
See application file for complete search history.

(56) References Cited

U.S. PATENT DOCUMENTS 9,067,796 B2 * 6/2015 Strupinski ............. C01B 32/188
9,242,865 B2 * 1/2016 Sinton ................... C23C 16/505
(Continued)

FOREIGN PATENT DOCUMENTS

CN    108408791 A    8/2018
CN    109616630 A    4/2019
(Continued)

OTHER PUBLICATIONS

"International Search Report and Written Opinion corresponding to International Application No. PCT/EP2021/052291 mailed Mar. 22, 2021".
(Continued)

*Primary Examiner* — Edmund H Lee
(74) *Attorney, Agent, or Firm* — Myers Bigel, P.A.

(57) ABSTRACT

A process for large-scale production of graphene comprising a step of applying graphene onto a movable surface carrying multiple particles using a PECVD-based process operating at low temperatures enabling the coating of materials that are at risk of melting, decomposing or deforming at higher temperatures. The graphene can be separated from said particles, and the particles re-circulated in the process. A production unit designed for continuous or semi-continuous large-scale production of graphene and graphene-coated particles, where said graphene-coated particles are either the desired end-product, or an intermediate. Graphene-coated particles, in particular particles where the graphene forms flakes having a desired orientation in relation to a surface of said particles.

3 Claims, 7 Drawing Sheets

(51) Int. Cl.
    *C23C 16/01*     (2006.01)
    *C23C 16/26*     (2006.01)
    *C23C 16/44*     (2006.01)
    *C23C 16/50*     (2006.01)
    *C23C 16/54*     (2006.01)

(52) U.S. Cl.
    CPC .......... *C23C 16/26* (2013.01); *C23C 16/4417* (2013.01); *C23C 16/50* (2013.01); *C23C 16/54* (2013.01); *C01B 2204/04* (2013.01); *C01P 2002/82* (2013.01); *C01P 2004/03* (2013.01)

(56) References Cited

U.S. PATENT DOCUMENTS

| | | | |
|---|---|---|---|
| 9,334,167 B2 * | 5/2016 | Silva | B82Y 40/00 |
| 10,850,496 B2 * | 12/2020 | Zhamu | B33Y 70/00 |
| 11,038,172 B2 * | 6/2021 | Jang | H01M 4/62 |
| 2009/0057605 A1 * | 3/2009 | Tokoro | G11B 5/712 |
| | | | 252/62.55 |
| 2013/0174968 A1 | 7/2013 | Vlassiouk | B82Y 30/00 |
| | | | 156/60 |
| 2014/0140917 A1 * | 5/2014 | Coleman | B82Y 40/00 |
| | | | 423/594.19 |
| 2014/0287155 A1 * | 9/2014 | Matsumoto | C23C 16/511 |
| | | | 427/535 |
| 2015/0252241 A1 * | 9/2015 | Jang | C09K 5/14 |
| | | | 252/74 |
| 2017/0154701 A1 | 6/2017 | Lee et al. | |
| 2017/0225233 A1 * | 8/2017 | Zhamu | C22C 49/14 |
| 2017/0253962 A1 * | 9/2017 | Chugh | C01B 32/182 |
| 2019/0088937 A1 | 3/2019 | Tzeng et al. | |
| 2019/0270644 A1 * | 9/2019 | Colominas Guardia | |
| | | | C01B 32/186 |
| 2020/0287216 A1 * | 9/2020 | Jang | H01M 4/386 |

FOREIGN PATENT DOCUMENTS

CN         109941990 A     6/2019
WO     2017192047 A1   11/2017

OTHER PUBLICATIONS

Ma, Yifei, et al., "Copper-Assisted Direct Growth of Vertical Graphene Nanosheets on Glass Substrates by Low-Temperature Plasma-Enhanced Chemical Vapour Deposition Process", Nanoscale Research Letters 10(1): 1-8 (Dec. 5, 2015).

Thiruvelu, Bhuvana, et al., "Contiguous Petal-like Carbon Nanosheet Outgrowths from Graphite Fibers by Plasma CVC", ACS Applied Materials & Interfaces 2(3):644-648 (Mar. 24, 2010).

* cited by examiner

DEVICE FOR LARGE-SCALE PRODUCTION OF GRAPHENE

STATEMENT OF PRIORITY

This application is a 35U.S.C. § 371 national phase application of PCT Application No. PCT/EP2021/052291 filed Feb. 1, 2021, which claims priority to Swedish Application No. 2050110-2 filed Feb. 3, 2020, the entire contents of each of which are incorporated by reference herein.

TECHNICAL FIELD

The present disclosure relates to the field of chemical vapor deposition and in particular to processes for the production of graphene, for example graphene as such, or graphene as a component of graphene coated or graphene encapsulated particles, as well as such particles. The present disclosure presents novel processes and a device for the production of graphene coated or graphene encapsulated particles, as well as particles produced thereby.

BACKGROUND

Graphene has attracted significant interest among both chemists and physicists due to its many exciting properties. Combining graphene with bulk materials also holds great promise. As an additive, flake graphene gives high strength to weight and can impart enhanced mechanical, thermal, and electronic properties to polymers even at very low concentrations. In the form of a continuous thin film or coating, graphene can be applied to a wide range of materials, providing a flexible, transparent, electrically conductive, corrosion resistant, gas impenetrable and atomically thin diffusion barrier. However, a significant challenge with graphene has been how to produce high quality graphene on a large scale.

A process for plasma enhanced chemical vapour deposition, PECVD, for the formation of graphene was developed at the California Institute of Technology, Caltech, and is disclosed inter alia in U.S. Pat. No. 9,150,418. Based on this technology, a prototype graphene production unit, FORZA™, was designed by CealTech AS, built and delivered to Stavanger in December 2017. The FORZA™ production unit was developed exclusively for the large-scale production of high-quality graphene flakes and coatings. FORZA™ was taken into use during 2018 and has been shown to be capable of coating large surfaces, up to 86 cm in width and 390 cm in length, with vertically arranged graphene flakes. The graphene is subsequently scraped off the surface and harvested as a powder.

In addition to the production of graphene flakes and powder, there is a growing interest in applying graphene coatings not only to flat surfaces, but also to particles.

WO2018052318 (Dynatech Engineering AS, Norway) discloses a process for producing silicon particles with specific size distribution. This process uses a rotating reactor, sequentially introducing a first reaction gas containing silanes, a second reaction gas, liquid or material comprises C, O or N in combination with silicon, such as SiOx, SiCx, SiNx; amorphous carbon, graphite, low-crystalline carbon or low range order graphene structures; C, O and N containing materials combined or replaced with a metal capable of alloying with lithium, for example Ge, GeOx, In, Bi, Mg, Ag, Zn, ZnOx, FeOx, SnOx and TiOx or alloys or composite alloys combining several metals in a structured geometrical pattern and/or in radially distributed layers outside the silicon core particle, alone or in any combination.

In one embodiment disclosed in WO2018052318, the silicon containing precursor is fed into a rotating heated process chamber to produce primary core particles. The particles are then harvested or retrieved and transported to a second low pressure PECVD chamber where a carbon containing precursor (e.g. acetylene, methane, propane or propylene) is introduced and decomposed forming a second carbon containing material on the particles of 1-10 nm in thickness that can be graphene. The particles are then retrieved and transported to a third process chamber where the carbon containing precursor is then reduced to a carbon containing solid material.

CN108408791 (Kunming University of Science and Technology, China) discloses a process for preparing graphene coated spherical $Co_3O_4$ powder through Microwave Plasma Chemical Vapour Deposition (MPCVD) using methane gas.

CN108788134 (Hanghai Levson Enterprise Group Co., Ltd., China) discloses a multi-step process for producing a graphene-nano-zinc-copper core-shell structured conductive film material having a particle diameter of 60-100 nm.

US2018072575 A1 (Imerys Graphite & Carbon Switzerland Ltd.) discloses a surface-modified carbonaceous material in particulate form, wherein the surface-modified carbonaceous particles comprise a carbonaceous core and nanoparticles attached to the surface of the carbonaceous particles.

There remains a need for the development of more efficient processes for the large-scale production of graphene as such, or graphene in the form of graphene coated or graphene encapsulated particles.

SUMMARY

The present inventors have developed a process for the production of graphene, where the graphene is deposited on particles, forming particles coated with graphene and even encapsulated in graphene, which process additionally makes it possible to control different quality parameters, such as the size and orientation of the graphene flakes.

According to a first aspect, the present disclosure makes available a continuous or semi-continuous process for the production of graphene, wherein particles comprising a core are introduced into a stationary deposition chamber where they are subjected to plasma enhanced chemical vapor deposition (PECVD) using a carbon-containing gas, forming solid graphene directly on the surface of said particles, whereupon said particles are harvested.

According to a preferred embodiment of the above aspect, said formation of graphene directly on the surface of said particles is performed as a one-step process without chemical pre-treatment of the particles and without the need for reduction of graphene oxide to graphene.

According to an embodiment, the graphene-encapsulated particles are used as such, or subjected to treatment removing and separating the graphene from the particle core, and where after said particles are optionally recirculated into said continuous or semi-continuous process for the production of graphene.

In the present process, said carbon-containing gas is chosen from gaseous mixtures containing two or more elements with one of them being C and the rest being one of or a combination of H, O, N, F, S, Cl, Br, not limited to these elements. The carbon-containing gas can also be a combination of two of more gases comprising the components above. In order to form doped graphene which is doped with a foreign element such as N, B and so on, a non-carbon-containing gas can be introduced into the system. Examples include, but are not limited to $C_xH_y$, $C_xH_yO_z$, $C_xH_yN_z$, $C_xH_yS_z$, $C_xH_yF_z$, $C_xH_yCl_z$ and $C_xH_yBr_z$, wherein x is any number 1-10, y is any number 1-20 and z is any number 1-10. Preferably said carbon containing gas is chosen from methane, ethane, propane, ethylene, ethyne, and gaseous ethanol.

According to an embodiment of the above first aspect, and freely combinable with all embodiments of said aspect, said process is operated at a temperature which is significantly lower than temperatures normally used in conventional CVD or PECVD processes, and preferably at a temperature in the interval of 25-650° C., more preferably 25-550° C., and most preferably at a temperature about or below 350° C., such as a temperature in the interval of 25-300° C., 25-250° C., 25-200° C., 25-150° C., or 25-100° C.

A second aspect of the present disclosure relates to a production unit for the production of graphene-coated particles, said production unit comprising at least one stationary main chamber (1) and, optionally, a second chamber (2), wherein a particle feeding unit or feeder (10), a movable substrate or support (20), at least one heating element (30), and a harvesting and collecting unit (50) such as a container, are located in said main chamber (1) and wherein, optionally, said collecting unit (50) is movable from the main chamber (1) to said, optional second chamber (2) without compromising the pressure, temperature or gas atmosphere of the main chamber (1).

According to a preferred embodiment of the second aspect, said movable substrate or support (20) is an endless belt, such as an endless steel belt.

According to another embodiment of the second aspect, the unit comprises a main chamber (1) and a second chamber (2), wherein the main chamber (1) is equipped with an openable and gas-tightly sealable closure, such as a shutter (53) and said shutter is situated downstream of said collecting unit (50), separating said main chamber and said second chamber (2).

A third aspect relates to a graphene-coated particle, comprising a core and a graphene layer surrounding said core, wherein said core is chosen from metal, metal oxide, metalloid, and non-metal particles, and wherein said graphene layer comprises graphene sheets or flakes oriented at an angle between the plane of the graphene sheets or flakes and the tangent plane of a surface of the particle ranging from 0 to 180°.

According to a preferred embodiment of said third aspect, said graphene sheets or flakes are substantially vertically oriented, i.e. oriented at an angle ($\alpha$) of about 90° to the tangent plane of a surface of the particle at their point of attachment to the particle.

According to another preferred embodiment of said third aspect said graphene layer has a thickness of up to 30 μm, as measured from a surface of the particle to the distal end of the outermost graphene flakes.

According to another preferred embodiment of said third aspect said graphene sheets or flakes are substantially horizontally oriented, i.e. oriented at an angle ($\beta$) of about 0 or about 180° to the tangent plane of a surface of the particle at their point of attachment to the particle. In a specific embodiment, the graphene is deposited in the form of flakes, substantially vertically oriented, forming "spiky" particles, and in another specific embodiment, the graphene is deposited in the form of flakes, substantially parallel to the surface of the particle, or only forming a small angle ($\beta$) to the surface, forming "smooth" particles.

According to an embodiment of the process according to the first aspect, or an embodiment of the graphene-coated particle according to the third aspect, said core is a metal particle, such as for example an iron particle, an aluminium particle, or a metal alloy particle, such as a metal alloy comprising iron in combination with one or more of nickel, chromium, manganese, molybdenum, and/or vanadium.

According to another embodiment of the process according to the first aspect, or the graphene-coated particle according to the third aspect, said core is a metal oxide particle, said metal oxide chosen from but not limited to $LiCoO_2$ (LCO), $LiFePO_4$ (LFP), and $LiNi_{0.8}Co_{0.15}Al_{0.05}O_2$ (NCA).

According to yet another embodiment of the process according to the first aspect, or the graphene-coated particle according to the third aspect, said core is a metalloid particle, such as a silicon (Si), germanium (Ge) or tin (Sn) particle.

According to a further embodiment of the process according to the first aspect, or the graphene-coated particle according to the third aspect, said core is chosen from the group of non-metal particles, such as a particle comprising or consisting substantially of a material chosen from diamond, organic polymer, glass fibers, carbon fibers and cellulose fibers.

According to an embodiment of the process according to the first aspect, or an embodiment of the graphene-coated particle according to the third aspect, freely combinable with any of the previous embodiments, said core is a substantially spherical particle having a diameter in the interval of about 10 nm to about 200 μm or a substantially cylindrical particle or fiber having a diameter in the interval of about 10 nm to about 500 μm and length of about 100 nm up to about 5000 μm.

According to an embodiment of the process disclosed herein, graphene is deposited in defined, and previously determined areas on said particles so that a desired pattern is formed.

The present disclosure also makes available composite materials comprising graphene-coated particles according to the third aspect, for example polymer materials reinforced or otherwise functionalized by inclusion of graphene flakes or graphene-coated particles, produced by the novel process.

A particular embodiment is a battery, preferably a rechargeable battery, wherein the anode and/or cathode material comprises graphene-coated particles according to said third aspect or an embodiment thereof.

The present disclosure also relates to the use of graphene-coated particles according to the third aspect, or manufactured using the process of the first aspect, in electronic circuits, circuit boards and semiconductors.

Other aspects and embodiments thereof will become evident to a skilled person upon study of the present disclosure, including the attached claims and drawings.

SHORT DESCRIPTION OF THE DRAWINGS

Different aspects and embodiments will be disclosed in closer detail in the following description, examples and claims, with reference to the attached figures in which:

FIGS. 9a and b illustrate in a simplified fashion how the use of particles expands the available surface available for the deposition of graphene.

DETAILED DESCRIPTION

Before the present invention is described, it is to be understood that the terminology employed herein is used for the purpose of describing particular embodiments only and is not intended to be limiting, since the scope of the present invention will be limited only by the appended claims and equivalents thereof.

It must be noted that, as used in this specification and the appended claims, the singular forms "a," "an," and "the" include plural referents unless the context clearly dictates otherwise.

The term "core" is used interchangeably with the term "particle" indicating the portion of a graphene coated particle which is not graphene, i.e. a core or an original particle onto which graphene is deposited. This definition does not exclude that said original particle in turn comprises a core and one or more layers surrounding said core.

The term "particle" includes particles of any size and shape, such a spherical or irregularly shaped particles, including fibers such as but not limited to polymer fibers, carbon fibers, glass fibers, and cellulose fibers. For applications in metallurgy and metal industry, metal particles or metal microspheres are available in a wide range of sizes from about 1 µm to about 1000 µm, for example 10-200 µm. Sometimes these are referred to as micropowders.

For use for example in batteries, particle sizes range between about 10 nm and about 100 nm for example for silicon, lithium, Ge, Sn and cathode particles including non-metal such as sulphur. For metal oxide or lithium metal oxide particles, sizes from about 100 nm up to 5 µm are commonly encountered, and particles in this interval are interesting for use in the present process. The process is however applicable to particles of different size.

The term "surface" as in "a surface of a particle" refers to the surface of the main outline of a particle. For example, a substantially spherical particle is considered to have a surface which is spherical, even if said particle exhibits some unevenness such as dents or protrusions. Similarly, a fiber is considered to have a cylindrical surface even though a fiber can be curved and have tapered ends. As an example, a fiber can be a particle having a diameter of from about 10 nm to about 500 µm, and a length of about 100 nm to about 5000 µm.

The terms "continuous" and "semi-continuous" are used herein to define that the graphene coating process is operated without major interruptions. In a continuous process, core particles are fed into a plasma zone, transported through said plasma zone, and harvested without interrupting the graphene coating taking place in the plasma zone. With a process and device as illustrated in FIG. 1b, the graphene-coated particles can even be removed from the chamber (1) without compromising the conditions (pressure, temperature, composition of the atmosphere) in said chamber. In a semi-continuous process, new uncoated particles can be added, either from a particle feeder or feeding unit (10) inside the main chamber (1) or from a second container (90) which is introduced into the main chamber (1) without compromising the conditions in said chamber.

Thus, when the graphene coating process in the plasma zone proceeds without interruption, or with only minimal interruption, the process as a whole is considered to be continuous, or at least semi-continuous even when coated particles are removed from and uncoated particles are introduced into the main chamber (1).

The term "stationary" used in the context of a "stationary deposition chamber" indicates that the chamber is not moved or dislocated during operation. The term "stationary" does not exclude that the equipment—in which the deposition chamber is a component—can be moved, e.g. transported from one location to another, or that the deposition chamber cannot be removed from the equipment, for example for cleaning or maintenance.

It is understood that process steps disclosed herein also define devices, units or equipment for performing said step, and that the disclosure of a device, a unit or equipment also discloses the operation thereof, i.e. a process step. For example, the disclosure of a feeder, e.g. a screw feeder for feeding particles onto a movable surface, also defines the process step of feeding said particles. Conversely, the disclosure of a collection or harvesting step, e.g. the collection or harvesting of coated particles, also discloses the provision of a device, unit or equipment for the collection or harvesting of coated particles of particles.

According to a first aspect, the present disclosure makes available a continuous or semi-continuous process for the production of graphene or graphene-coated particles wherein particles comprising a core are introduced into a stationary deposition chamber and into a plasma zone within said chamber where they are subjected to plasma enhanced chemical vapor deposition (PECVD) using a carbon-containing gas, forming solid graphene directly on the surface of said particles, whereupon said particles are harvested.

According to a preferred embodiment of the above aspect, said coating is performed as a one-step process without chemical pre-treatment of the particles and without the need for reduction of graphene oxide to graphene. Here, the term "one-step process" is used to define that the particles are fed into a graphene-deposition zone and subjected to deposition of graphene directly on the particle surface and harvested without reduction of carbon to graphene.

According to another embodiment, freely combinable with the above, said graphene is removed from the surface of the particles and separated from the particles, the graphene collected, and optionally said particles are recirculated into said continuous or semi-continuous process for the production of graphene.

In the present process, said carbon-containing gas is chosen from gaseous mixtures containing two or more elements with one of them being C and the rest being one of or a combination of H, O, N, F, S, Cl, Br, not limited to these elements. The carbon-containing gas can also be a combination of two of more gases having the molecular structure above. In order to form doped graphene which is doped with a foreign element such as N, B and so on, a non-carbon-containing gas can be introduced into the system. Examples include, but are not limited to $C_xH_y$, $C_xH_yO_z$, $C_xH_yN_z$, $C_xH_yS_z$, $C_xH_yF_z$, $C_xH_yCl_z$ and $C_xH_yBr_z$, wherein x is any number 1-10, y is any number 1-20 and z is any number 1-10. Preferably said carbon containing gas is chosen from methane, ethane, propane, ethylene, ethyne, and gaseous ethanol.

Said process is performed at a temperature which is significantly lower than temperatures normally used in conventional CVD or PECVD processes, and preferably at a temperature in the interval of 25-650° C., more preferably 25-550° C., and most preferably at a temperature about or below 350° C., such as in the interval of 25-300° C., 25-250° C., 25-200° C., 25-150° C., or 25-100° C.

According to an embodiment of said process, the plasma power is adjusted depending on the desired properties of the graphene-coating, and operated at 1-30 kW, preferably 1-20 kW, or at about 5 kW, 10 kW, 15 kW, 20 kw, 25 kW or 30 kW.

The process according to any one of the preceding claims, wherein the particles are transported through the plasma zone at a speed of 0.1-10 m/min, 0.1-7 m/min, such as 0.1-6 m/min, or at about 0.5 m/min, 1 m/min, 2 m/min, 3 m/min, 4 m/min, or 5 m/min.

Another aspect relates to a production unit for the production of graphene-coated particles, said production unit comprising at least one stationary main chamber (1) comprising a plasma zone and, optionally, a second chamber (2), wherein a particle feeder (10), a movable substrate or support (20), at least one heating element (30), at least one ionized plasma generator (40), and a collecting unit (50) are located in said main chamber (1).

According to an embodiment, said movable substrate or support (20) is an endless belt, for example an endless steel belt, adapted to transport particles through a plasma zone towards a harvesting zone.

Figure 1A:
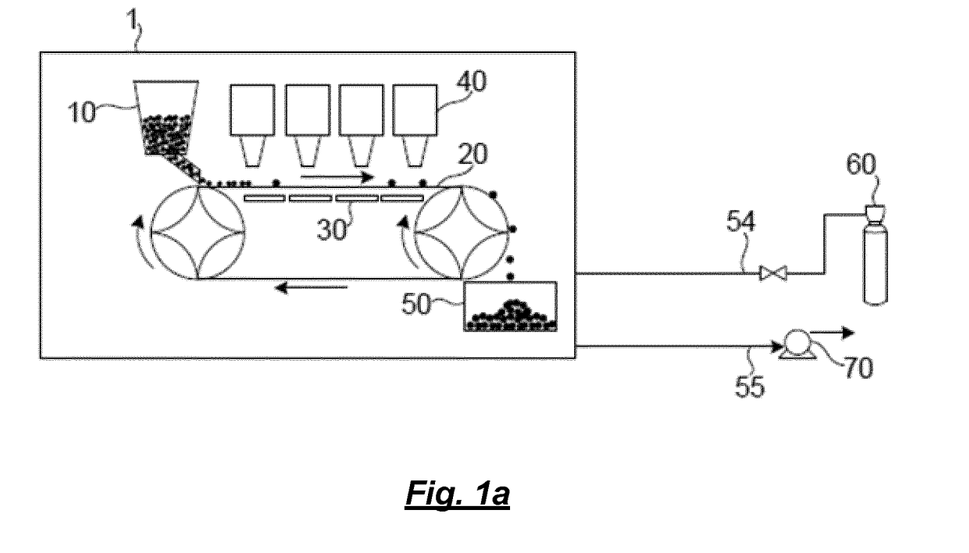
FIG. 1a schematically shows a production unit for applying graphene coating to a substrate in particulate form, said production unit having a main chamber (1).
Figure 1B:
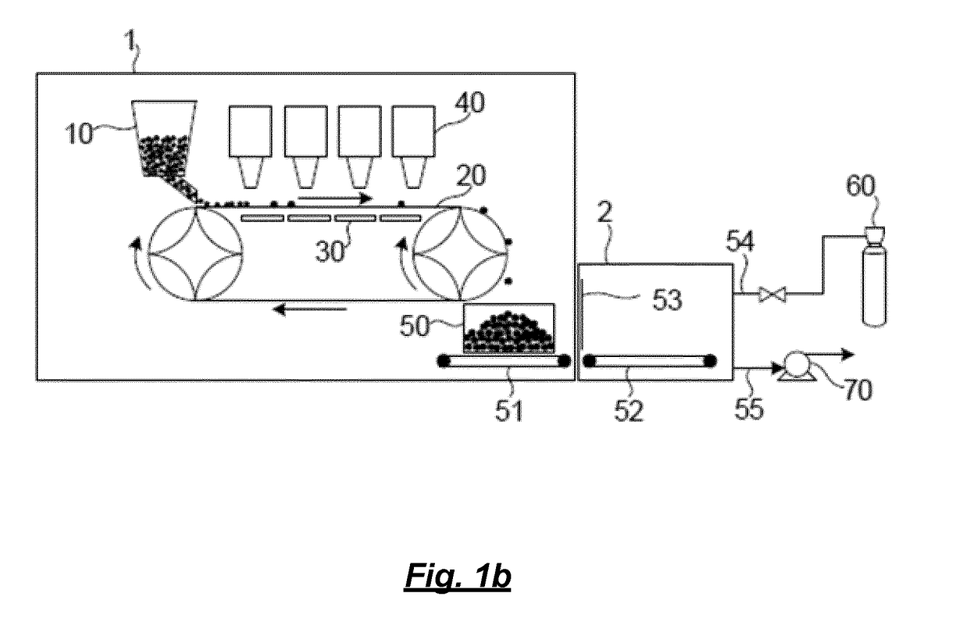
FIG. 1b schematically shows an embodiment of a production unit having a main chamber (1) and additionally a second chamber (2) enabling continuous or at least semi-continuous operation of the production unit during extended periods of time.

A first embodiment is schematically shown in FIG. 1a having a main chamber (1) which is closed gas-tightly after loading a particle feeder unit (10) with the particles to be coated. The particle feeder or feeding unit (10) has a container, compartment or silo for holding neat particles and a feeder, e.g. a screw feeder for introducing the particles onto a movable substrate (20). The movable substrate or support (20) is for example an endless steel belt, which can be controlled to move at a desired speed, transporting the particles through a plasma zone. The combination of particles and an endless belt makes it possible to present a large surface onto which graphene is deposited, allowing for example a large-scale production of graphene flakes.

The chamber is pressurized using conduits (54) and (55) connected to a source of dry gas (60) and a vacuum pump (70). The pressure inside the chamber (1) as well as the composition of the gas in the chamber (1) is adjusted as desired.

During operation, the ionized plasma generator (generators) (40) is (are) activated, and the movable substrate or support (20), for example an endless steel belt, is put into motion and the speed adjusted to a pre-set value. The at least one heater (heaters) (30) is (are) activated and the temperature adjusted to a pre-determined temperature. When stable conditions are established, the particle feeder (10) is activated to feed or dispense particles onto the support (20). The particles are transported through a plasma zone which optionally is heated to a desired temperature or maintained at room temperature. The temperature, the atmosphere (i.e. choice and concentration of gases), and the speed of the movable support are adjusted as desired. Graphene-coated particles are produced in a continuous fashion on the slowly moving substrate or support, and ultimately harvested and collected in a collecting unit (50), such as a container optionally also having a blade or similar (not shown) adjacent to the moving substrate, adapted to scrape particles off the moving substrate.

FIG. 1b shows an embodiment where a second chamber (2) is connected to the main chamber (1) and separated therefrom by an openable gas-tight closure, such as a shutter (53). The second chamber (2) is pressurized using the conduits (54) and (55) connected to a source of dry gas (60) and a vacuum pump (70). The pressure and composition of the gas in the chamber (2) is adjusted to be identical to the conditions in the main chamber (1) so that the shutter can be opened without influencing the ongoing coating process. Thereby the collecting unit (50) can be moved from the main chamber (1) to the, optional, second chamber (2) without compromising the pressure, temperature or gas atmosphere of the main chamber, and without discontinuing the coating process. When the shutter is closed, the second chamber (2) can be depressurized and the coated particles removed from the production unit. This allows for longer, continuous coating operations where the already coated particles can be removed from the production unit. This offers improved control of the coating and minimizes the time the particles are exposed to the conditions in the main chamber (1). This is particularly advantageous when graphene coating is applied to particles having a low melting point, or particles of a material that is at risk of decomposing or deforming at the conditions in the main chamber (1). The arrangement allows the operation of the graphene-coating process at conditions which are bordering to too harsh for the particle cores, as the ready graphene-coated particles can be removed from the process chamber without interrupting the coating process.

Figure 1C:
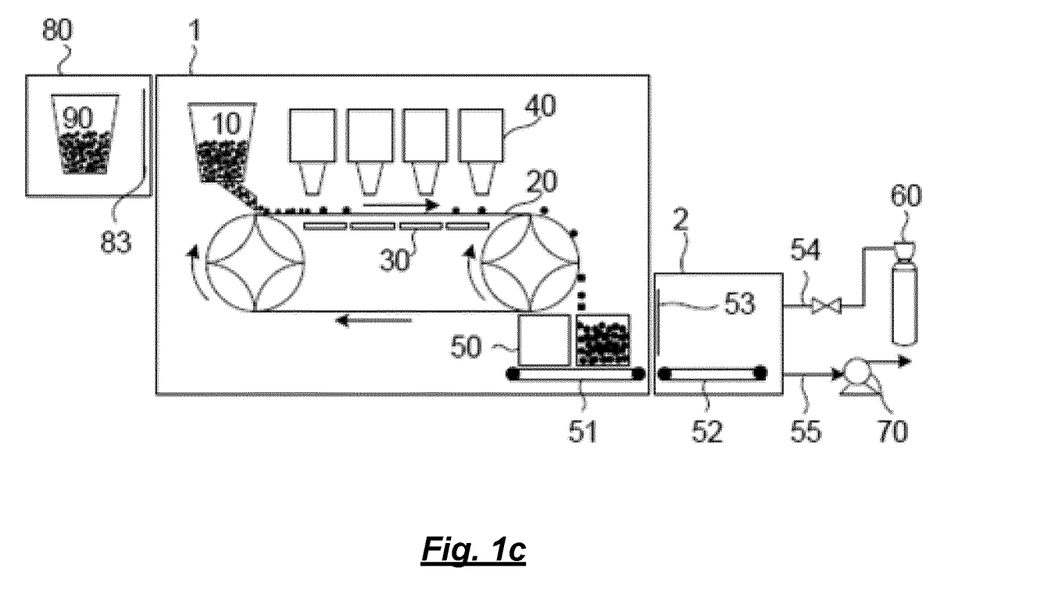
FIG. 1c schematically shows another embodiment of a production unit having a main (1), second (2) and third chamber (80), enabling continuous operation of the production unit during extended periods of time.

FIG. 1c schematically shows another embodiment, where a third chamber (80) is connected to the main chamber (1) and separated therefrom by an openable gas-tight closure (83), for example a shutter. Said third chamber holds one or more containers (90) for holding particles to be coated. The pressure and composition of the gas in the third chamber (80) is adjusted to be identical to the conditions in the main chamber (1) so that the shutter can be opened without influencing the ongoing coating process. This allows the replenishment of the particles in the feeding unit (10) during operation, as well as the addition of different particles, or a different mix of particles, without discontinuing the coating process. This further adds to the flexibility of the device and process disclosed herein.

Figure 1D:
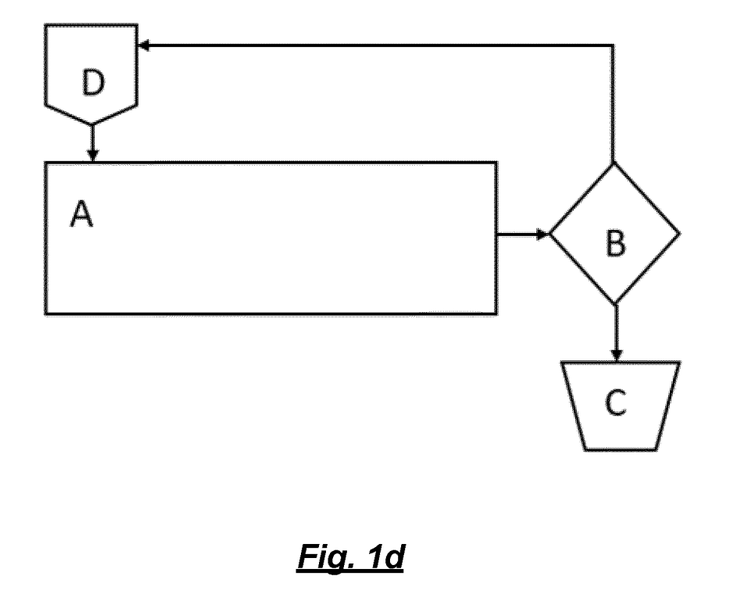
FIG. 1d schematically shows yet another embodiment, indicating how particles are recirculated, and utilized as substrate for large-volume production of graphene. In the figure, "A" denotes an apparatus as indicated in FIGS. 1a, b and c, "B" is an arrangement for separating graphene from the particles for example by brushing, shaking or sieving the particles, or a combination thereof, whereupon the graphene fraction is collected in a suitable container "C" and the particles recirculated to a storage and feeding unit "D" with or without further cleaning.

FIG. 1d schematically shows yet another embodiment, where one example of the re-circulation of particles is shown. In FIG. 1d, item "A" indicates a coating apparatus or arrangement as shown in any one of FIGS. 1a, b and c, whereas item "B" indicates an apparatus for separating graphene from the particles, either chemically or mechanically, or through a combination of both, into a graphene fraction substantially free from particles, which can be collected in "C" and a particle fraction substantially free from graphene which is recirculated into the graphene deposition process, preferably via an intermediate storage and feeding unit "D".

The graphene is separated from the particles by a suitable process, such as a mechanical process, for example brushing or shaking using a screen or sieve retaining the particles but allowing the graphene to pass through. In the alternative, the graphene coated particles can be sonicated in a liquid media, e.g. water or an organic solvent, and the graphene recovered following filtration and evaporation of the liquid. Said liquid is preferably recovered and recirculated. The particle cores are dried and reused.

As can be seen in all of FIGS. 1a, b, c and d, at least one ionized plasma generator (40) is arranged proximal to a portion of the movable substrate or support (20), creating a plasma zone which encompasses at least a portion of the movable substrate or support (20). At least one heating element (30) is/are also arranged proximal to the movable substrate or support (20), preferably overlapping the plasma zone. A collecting unit (50) is arranged so that graphene coated particles are removed from the movable substrate or support (20) and collected in said unit.

The collecting unit can for example be an open or openable container into which the coated particles fall by gravity, or into which said particles are scraped by the action of a blade, an edge, a brush or similar (not shown), which engages the surface. As shown in FIGS. 1b and 1c, the collecting unit (50) rests on a transporter or other mechanism for moving at least the container part of said collecting unit (50), for example a first conveyor belt (51), arranged inside the main chamber (1), ending in proximity of a second conveyor belt (52), arranged outside the main chamber (1), but inside the second chamber (2).

As mentioned above, the second chamber (2) is separated from the main chamber (1) by an openable gas-tight closure, such as a shutter (53). The second chamber (2) is equipped with a conduit (54) leading to a source (60) of dry gas, and a conduit (55), leading to a vacuum pump (70). By this arrangement, the atmosphere in the second chamber can be controlled and adjusted as desired, and thus a full collecting unit can be removed from the main chamber without adversely influencing the atmosphere in the main chamber, and similarly, an empty collecting unit can be reintroduced into the main chamber. When the shutter (53) is closed, the second chamber can be vented to the atmosphere, and allowed to return to ambient temperature and pressure for removal of the product. After evacuating the second chamber, the shutter can be opened, and the collecting unit returned into the main chamber.

It is also conceived that there are several collecting units in the main chamber, allowing the sequential, batch-wise collection of graphene coated particles without interrupting the coating process, or with only minimal interruptions. This arrangement enables a continuous or semi-continuous large-scale operation, which is a considerable advantage.

A third aspect relates to a graphene-coated particle, comprising a core and a graphene layer surrounding said core, wherein said core is chosen from metal, metal oxide, metalloid, and non-metal particles, and in that said graphene layer comprises graphene sheets or flakes oriented at an angle between the plane of the graphene sheets or flakes and the tangent plane of the surface of the particle ranging from 0 to 180°.

Figure 3:
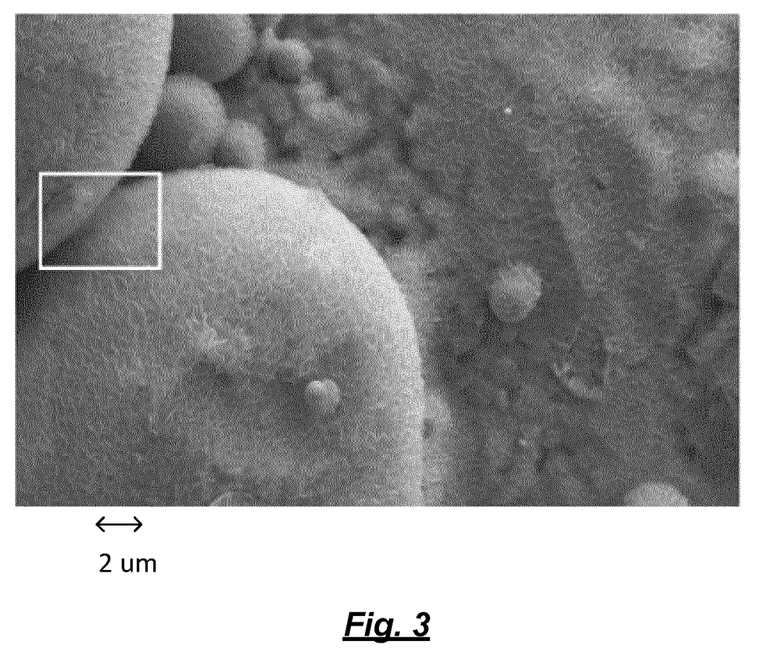
FIG. 3 shows a SEM image of Inconel 625® alloy particles after subjecting the metal powder to plasma enhanced CVD using a process and device as disclosed in the attached claims.
Figure 4:
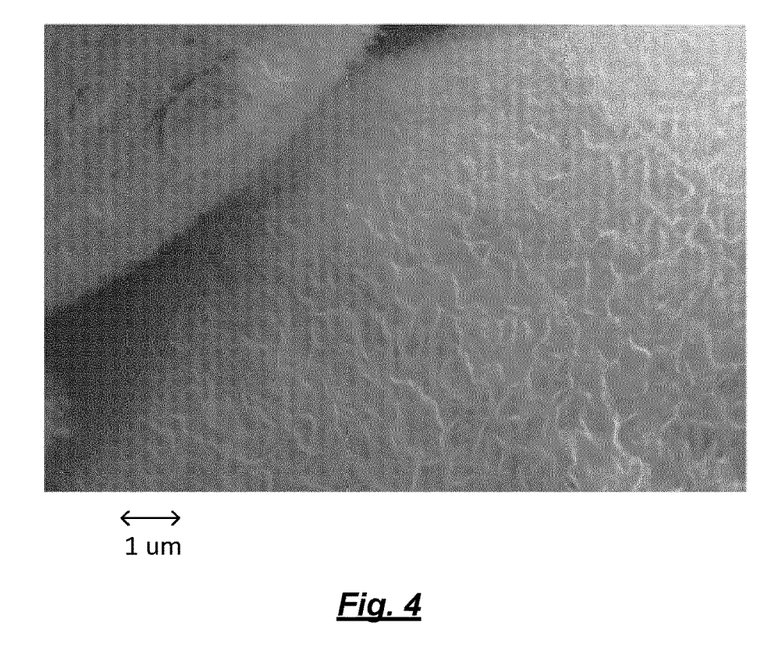
FIG. 4 shows a zoomed-in view of a selected area of the image in FIG. 2 (the white frame in the upper left corner).

The orientation of the graphene flakes can be determined by analysing SEM images, and the angles measured. FIG. 3 shows a SEM image of metal particles produced according to the present process, and FIG. 4 shows a detail view where the graphene sheets can be seen. Also FIG. 7 shows particles produced according to the claimed process, here Si particles.

Figure 7:
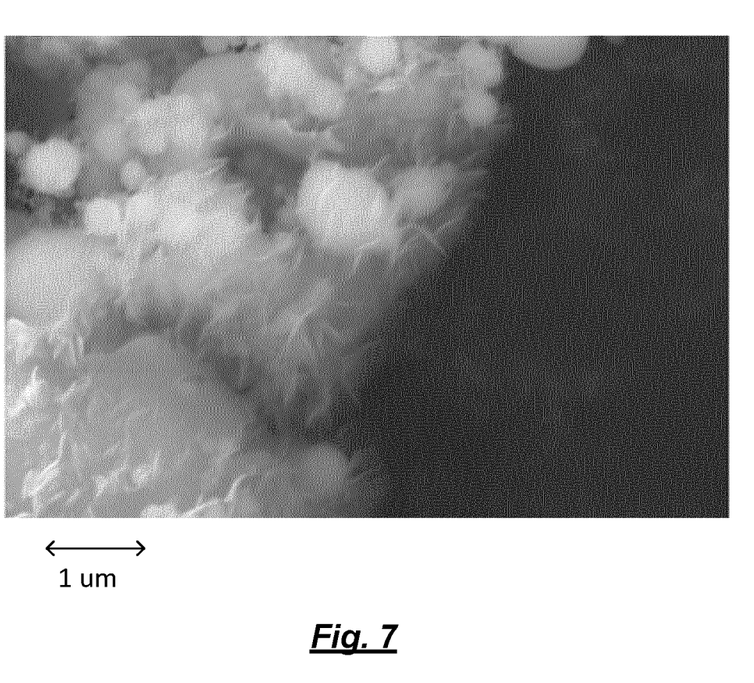
FIG. 7 shows a SEM image of the same Si particles after plasma they have been subjected to plasma enhanced CVD using a process and device as disclosed in the attached claims.

It is contemplated that the orientation of the flakes can be controlled by adjusting the process parameters, that the orientation will not be entirely uniform, but particles with predominantly vertically oriented flakes ($\alpha$ approximately 90°) can be formed, such as the "spiky" particles shown in FIG. 7, or "smooth" particles as shown in FIG. 4, where the flakes are predominantly oriented at a small angel ($\beta$) in relation to the surface of the particle.

Figure 9:
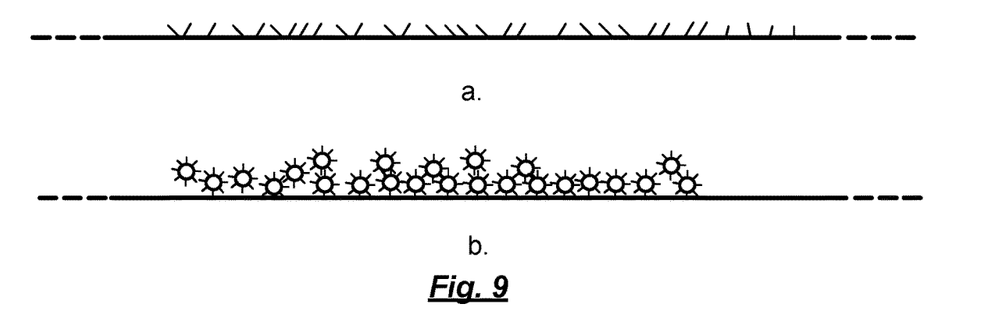
Figure 10:
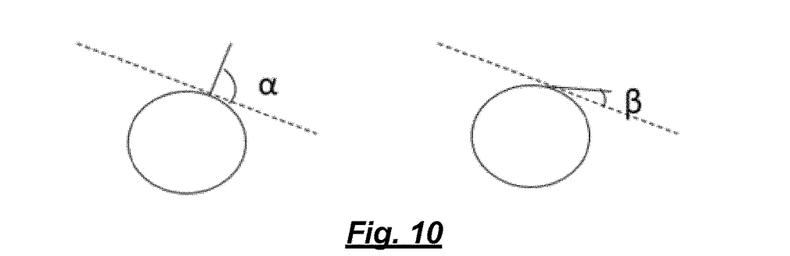
FIG. 10 illustrates how the angles $\alpha$ and $\beta$ are determined.

FIG. 9 is a simplified illustration of how the use of particles as the substrate significantly increases the surface available for the deposition of graphene. On a two-dimensional substrate, as shown in FIG. 9a, the area of the available surface is strictly limited by the dimensions of the substrate, which in turn is limited by the dimensions of the apparatus. When the surface is arranged in the form of an endless belt, which is moved through the deposition chamber, a larger surface becomes available, and semi-continuous or continuous operation becomes possible. However, when particles are introduced, the available surface increases significantly, and additionally, the combination of particles and a moving surface carrying said particles exponentially increases the available surface area and thus the production capacity.

Figure 11:
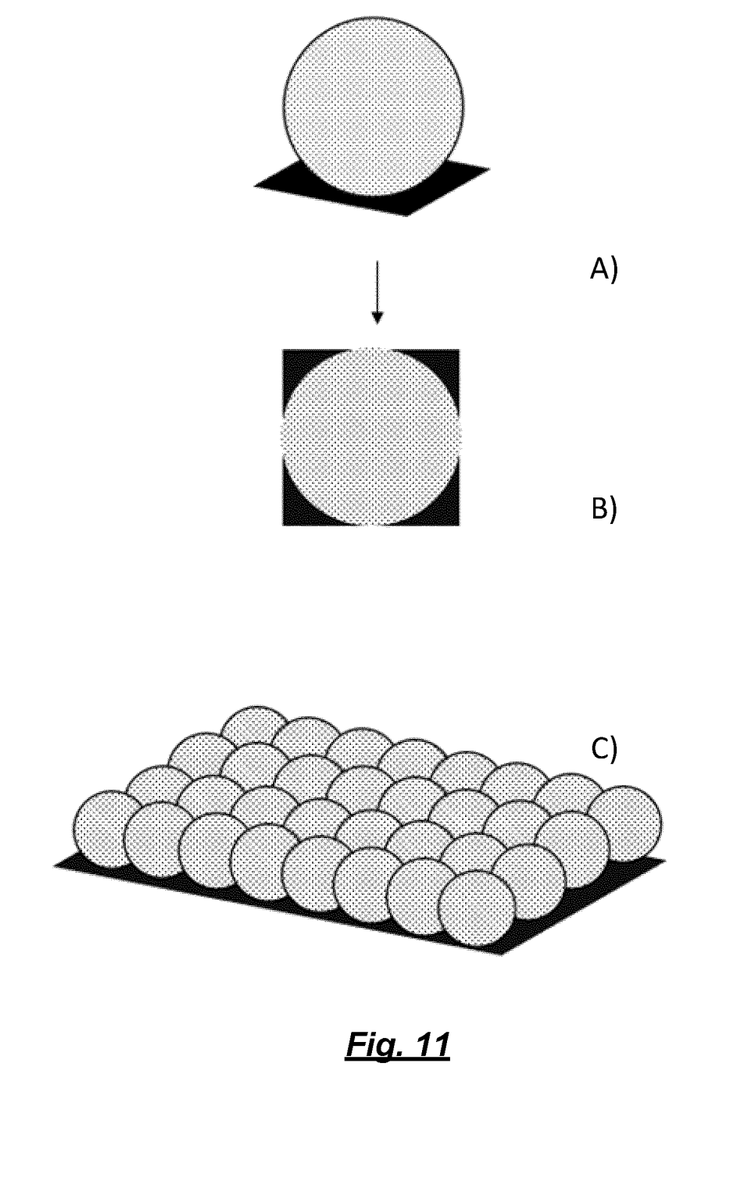
FIG. 11 illustrates the increase in available surface for the deposition of graphene, based on the assumption that spherical particles are used. The area of a sphere (A) is calculated using the formula $\pi d^2$, whereas the area occupied by a sphere (B) on a substrate is calculated as $d^2$. It then follows that when a substrate is covered by an even layer of spheres (C), the theoretical increase of the area equals $\pi$.

FIG. 11 illustrates, assuming that the particle is a perfect sphere, how the area of said sphere is $\pi d^2$ (A), whereas the area occupied by a sphere (B) on a substrate is calculated as $d^2$. It follows that when a substrate is covered by an even layer of spheres (C), the theoretical increase of the area equals $\pi$. If several layers of particles are added, the theoretical increase equals n times $\pi$, where n is the number of layers.

According to an embodiment of said third aspect, said graphene sheets or flakes are substantially vertically oriented, i.e. oriented at an angle ($\alpha$) of about 90° to the tangent plane of a surface of the particle at their point of attachment to the particle. The possibility to control the orientation of the graphene flakes is highly advantageous, as it makes it possible to tailor the properties of the graphene-coated particles. For example, a particle having substantially vertically oriented graphene flakes will exhibit an extremely large surface area.

Preferably said graphene layer has a thickness of up to 30 µm, as measured from a surface of the particle to the distal end of the outermost graphene flakes.

According to an alternative embodiment, said graphene sheets or flakes are substantially horizontally oriented, i.e. oriented at an angle (β) of about 0 or about 180° to the tangent plane of the surface of the particle at their point of attachment to the particle. For a schematic illustration of the orientation of the graphene flakes, please see FIGS. 3 and 4, and FIG. 7.

According to an embodiment of the process or an embodiment of the graphene-coated particle, said particle is a metal particle, such as for example an iron particle, an aluminium particle, or a metal alloy particle, such as a metal alloy comprising iron in combination with one or more of nickel, chromium, manganese, molybdenum, and/or vanadium.

According to an embodiment of the process or an embodiment of the graphene-coated particle, said particle is a metal oxide particle, said metal oxide particle chosen from but not limited to $LiCoO_2$ (LCO), $LiFePO_4$ (LFP), and $LiNi_{0.8}Co_{0.15}Al_{0.05}O_2$ (NCA) particles.

According to an embodiment of the process or an embodiment of the graphene-coated particle, said particle is a metalloid particle, such as a silicon (Si), germanium (Ge) or tin (Sn) particle.

According to an embodiment of the process or an embodiment of the particle, said particle is a non-metal particle, comprising or consisting essentially of a non-metal material such as diamond, an organic polymer, glass fiber, carbon fiber, and cellulose fiber.

According to an embodiment of the process or an embodiment of the graphene-coated particle, said particle is a substantially spherical particle having a diameter in the interval of 10 nm to 200 µm or a substantially cylindrical particle having a diameter in the interval of 10 nm to 500 µm and a length of 100 nm to 5000 µm.

According to one embodiment of the process or an embodiment of the graphene-coated particle, the graphene is deposited or has been deposited in determined areas on said particle so that a desired pattern is formed. Graphene can for example be deposited on only part of a particle, such as half the surface of a spherical particle, i.e. a semi-spherical surface, a spherical cap or a spherical lune. By adjusting the speed of the movable surface, and thus the time the particles are exposed to the plasma, the degree of graphene-coating can be controlled. Other parameters that influence the deposition of graphene flakes are the plasma effect, exposure time, heating (including the temperature, duration as well as the direction of heating), composition of the carbon containing gas and mixture of gases, as well as combination of the above.

Another aspect of the disclosure relates to composite materials comprising graphene-coated particles according to any one of the disclosed aspects and embodiments. Examples of such composite materials include polymers which are functionalized, for example reinforced by addition of graphene-coated particles.

A specific example is a battery, preferably a rechargeable battery wherein the anode and/or cathode material comprises graphene-coated particles according to the present disclosure.

The process is applicable to a large variety of materials in particulate form, including metals, metalloids, metal oxides as well as non-metal materials to form the particle coated with graphene.

This type of process produces graphene in a so-called bottom-up fashion. By comparison, a conventional top-down process leads to poor control of the quality of graphene, generation of large amount of toxic chemicals and by-products, as well as the introduction of impurities into the graphene such as unwanted chemical groups and elements. Due to difficulties in separating the graphene sheets from bulk graphene powder and creating homogeneous dispersion of graphene sheet on the particles, it is challenging to coat particles with graphene produced by conventional processes.

The process disclosed herein and as defined in the attached claims overcomes the disadvantages of the prior art methods/processes and substantially reduces or eliminates emissions, improves control of quality and product parameters, and provides a homogenous coating on the particles all in one process. The inventive process and embodiments thereof allow easy up-scaling and industrial application, providing a novel approach to large-scale graphene production. Additionally, the use of particles as the substrate for the deposition of graphene significantly increases the available surface.

Another bottom-up process is the conventional chemical vapor deposition (CVD) which is frequently used for producing graphene coated surfaces. This however involves much more demanding production conditions. For example, conventional CVD requires rather high temperatures around 1000° C. Another drawback associated with conventional CVD processes is the low reaction speed to form graphene from carbon source materials. Therefore, conventional CVD does not only consume a large amount of energy, but the harsh thermal environment limits the range of materials that can be subjected to the process. Compared to CVD process, the technology disclosed herein is compatible with a significantly larger selection of materials, i.e. materials which are at risk of melting, deforming or decomposing at the temperatures typical for conventional CVD processes.

The resulting graphene-coated or graphene encapsulated particles exhibit interesting properties. As shown in the SEM images (FIGS. 3, 4 and 7) the particles are covered by an even and dense carpet-like layer of substantially vertically oriented graphene flakes. The graphene flakes have a size of about 500 nm across the entire area. This layer of coating can be up to 30 µm. The pore size among the graphene array varies between 200-500 nm. The coated layer shows very good homogeneity.

The particles can be used in combination with other materials, for example to create conducting polymers, for strengthening epoxies and elastomers, and for coating various materials. Applying a graphene coating to particles and then incorporating these particles into different materials makes it possible to adjust the resistance against oxidation and UV-degradation of a material, as well as to influence the barrier functions, for example the function as a barrier against gas or UV light. Additionally, properties such as mechanical strength, tensile strength, conductivity, and reflectance can be modified by the addition of the graphene-coated particles disclosed herein.

Graphene-coated particles according to any one of the above aspects and embodiments can also find use in sensors, electronic circuits and semiconductors.

EXAMPLES

Example 1

Applying Graphene Directly onto Metal Particles

Inconel 625® powder was obtained from PM Norway A/S, Stavanger, Norway, with an average size of 100 µm and used as received. Inconel 625® is a corrosion resistant Ni/Cr/Fe alloy that is very versatile, and durable in many demanding corrosive environments.

The inventors set out to investigate if metal particles could be coated with graphene and decided to use Inconel 625® as an example. The particles were loaded into the raw material feeding unit of a PECVD device as illustrated in FIG. 1. The chamber of the device was evacuated by vacuum pump to approximately 5 mTorr. $CH_4$, $H_2$ and Ar gas were introduced into the chamber simultaneously at flow rates of 500 sccm, 700 sccm and 200 sccm respectively while maintaining the pressure in the production chamber at around 140 mTorr.

In operation, the particles were fed onto a moving substrate. The coating was realized by means of plasma enhanced CVD. The plasma was activated while power was set at 5.5 kW. The moving substrate transported the particles through the plasma zone at a variable speed that could be set up to 25 cm/min. The moving substrate can operate in stationary or moving mode or a mix of stationary and moving mode as desired, and as controlled by a programmable control unit, developed by the inventors. The substrate can be heated by heating elements arranged in close proximity to the substrate. The heating elements are controllable to heat the substrate from room temperature to 700° C.

In examples 1 and 2, the moving substrate held a speed of 0.5 cm/min and was heated to a temperature of 500° C. The process was finished 20 minutes after activation of the plasma. The chamber was vented with Ar gas to atmospheric pressure after the substrate cooled down. The as-formed product was then characterized by Raman spectroscopy and Scanning electron microscope (SEM).

The particles were analysed before and after the coating using a scanning electron microscope (Zeiss SEM system, Zeiss Germany) and Raman spectroscopy (Renishaw inVia™ Raman system using a 532 nm laser). The purpose was to provide information of the powder particles with and without graphene coating, before and after the PECVD process.

The SEM images clearly show the morphological difference. Raman characterization verified the compositional difference via Raman signals which are specific for graphene.

Figure 2:
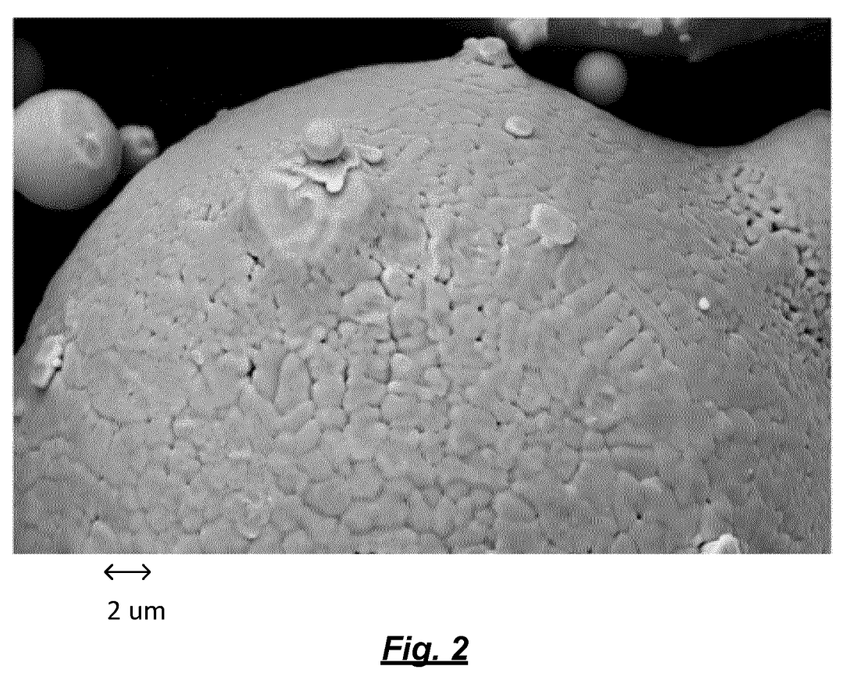
FIG. 2 shows a SEM image of Inconel 625® alloy particles before they have been subjected to a process as defined in the attached claims.

FIG. 2 shows a SEM image of Inconel 625® alloy particles before they have been subjected to a process as defined in the attached claims. The particle size varies from 2 µm to 200 µm, the average size being 100 µm. The image was taken using 10.00 K magnification, aperture size 30.00 µm scan speed 9, a working distance of 12.1 mm and 15.00 kV electron high tension voltage (EHT). As can be seen in the SEM image, the surface of the particles is smooth.

FIG. 3 shows a SEM image of an Inconel 625® alloy particle after subjecting the metal powder to plasma enhanced CVD using a process and device as disclosed in the attached claims. The magnification and aperture size were the same as in FIG. 1, the scan speed 6, the working distance 10.4 mm and electron high tension voltage (EHT) 10.00 kV. The shape of the particles is still visible while the surface morphology has changed significantly due to the graphene coating. The neat alloy particles have spherical shape and a smooth surface. After PECVD process, it can be seen in the SEM image at the magnification of 10,000 times that a layer of a homogeneous array of flakes is deposited on the surface of the spherical particles across the entire area.

FIG. 4 shows a zoomed-in view of an area in FIG. 2 (the white frame in the upper right corner) using 30.00 K magnification. Here it can be seen more clearly how the graphene sheets are aligned vertically to the point where they are formed on the surface of the particle. The graphene sheets resemble scales raising from the particle surface. The graphene sheets have an even size of approximately 500 nm (longest dimension of the flakes). The size of the pores among the array of sheets is concentrated at the range of 200 nm to 500 nm.

Figure 5:
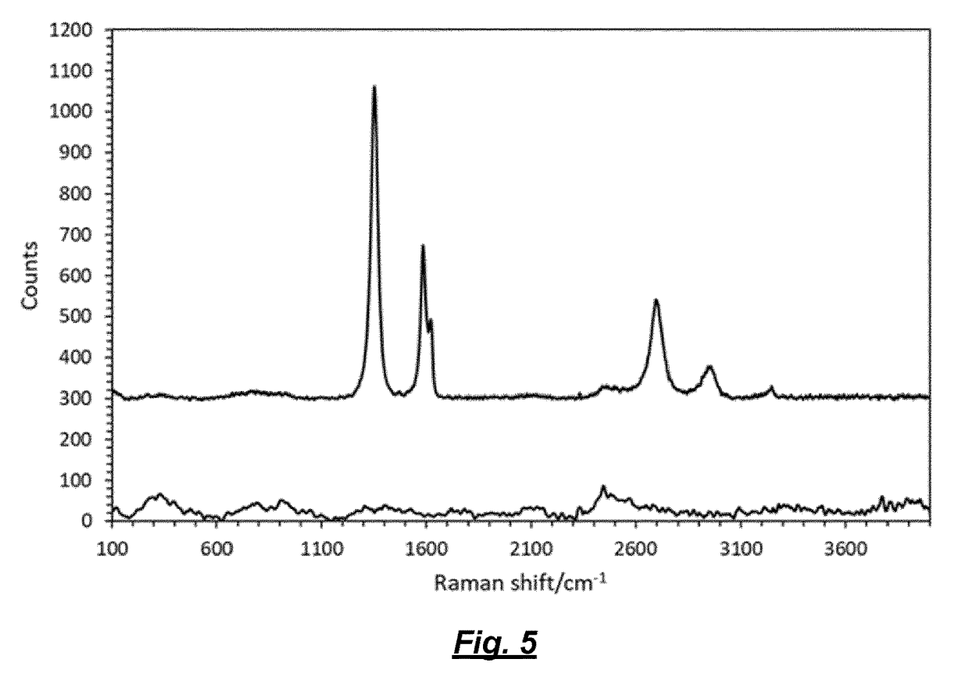
FIG. 5 shows a comparison of the Raman spectra of the Inconel 625® alloy particles before (lower curve) and after having been subjected to plasma enhanced CVD using a process and device as disclosed in the attached claims (upper curve).

FIG. 5 shows a comparison of the Raman spectra of the Inconel 625® alloy particles before (lower curve) and after having been subjected to plasma enhanced CVD using a process and device as disclosed in the attached claims. (upper curve). The appearance of peaks at 1350 $cm^{-1}$, 1588 $cm^{-1}$, 1620 $cm^{-1}$ and 2701 $cm^{-1}$ in the upper curve are typical Raman characteristics of the D, G and 2D peaks of graphene.

Example 2

Applying Graphene Directly onto Metalloid Particles

Using the same equipment as in Example 1, the inventors also experimented with silicon particles. Silicon crystalline particles having a purity ≥99%, and an average size of 100 nm, were received from Alfa Aesar/Thermo Fisher GmbH, Kandel, Germany, and used as received. The device was operated as described in Example 1, using the same parameters.

Figure 6:
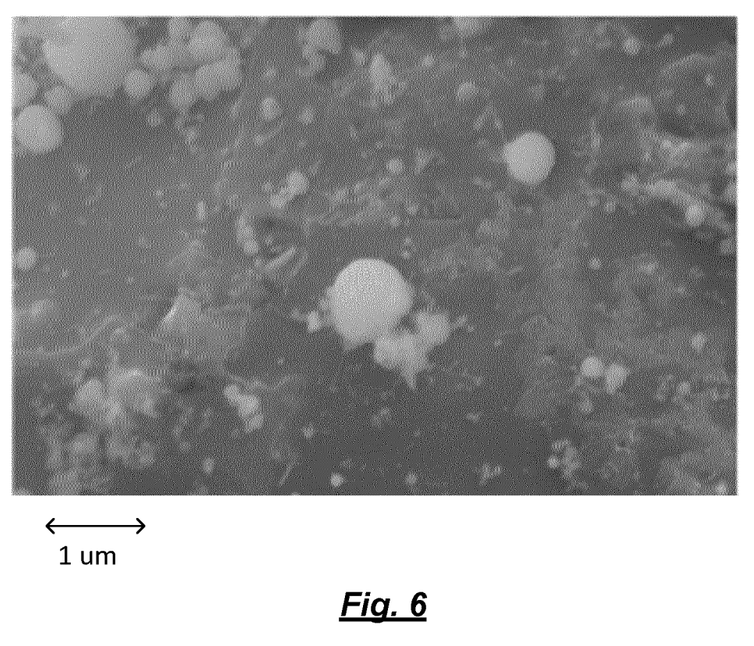
FIG. 6 shows a SEM image of Si particles before they have been subjected to a process as defined in the attached claims.

FIG. 6 shows a SEM image of Si particles before they have been subjected to a process as defined in the attached claims. The image was taken using 50.00 K magnification, aperture size 30.00 µm, scan speed 9, a working distance of 11.1 mm and 10.00 kV electron high tension voltage (EHT). In the SEM image, the Si nanoparticles appear as bright spheres which have a diameter in the range of from approximately 10 nm to approximately 500 nm and an average diameter of approximately 100 nm. The particle surfaces are free of other substances.

Figure 8:
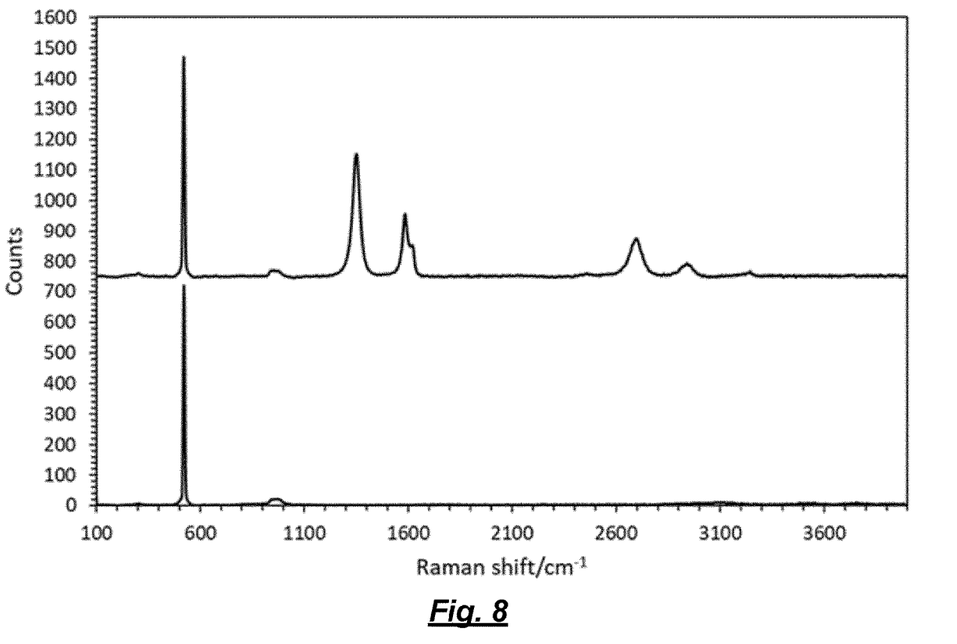
FIG. 8 is a comparison of the Raman spectra of Si particle before (lower curve) and after PECVD using a process and device as disclosed in the attached claims (upper curve).

FIG. 7 shows a SEM image of the same Si particle after plasma they have been subjected to enhanced CVD using a process and device as disclosed in the attached claims. The Si nanoparticles which appear as bright beads in FIG. 6 are now coated with vertical sheets which are verified to be graphene via Raman spectroscopy, as shown in FIG. 8. The graphene sheets have an average size of approximately 200 nm.

FIG. 8 is a comparison of the Raman spectra of Si particle before (lower curve) and after PECVD (upper curve). Peak at 520 $cm^{-1}$ is attributed to Si, the appearance of peaks at 1350 $cm^{-1}$, 1588 $cm^{-1}$, 1620 $cm^{-1}$ and 2701 $cm^{-1}$ are typical Raman characteristics of D, G and 2D peaks of graphene.

The results showed that the process and device disclosed herein is applicable to both metallic and metalloid particles, and that it allows precise control of the quantity of graphene deposited on the particles. The process and device also enable a versatility with regard to the morphology and quality of the graphene as shown in the SEM images.

The precise control of the quantity of the graphene coating on the particles is feasible through tuning the process parameters including plasma power, feed gas composition, process duration, speed at which the particles are transported through the plasma deposition zone. By changing the gas composition, for example, concentration and ratio of carbon-based gas to hydrogen, the number of layers, size and crystallinity of graphene can change accordingly. The type of carbon source also has an impact on the formation of graphene in terms of production volume and quality. The versatility of this technology enables continuous production and customization of graphene coated material.

Compared to the conventional way of producing graphene through CVD requiring high temperatures, often temperatures around 1000° C., the present device and processes enable the use of significantly lower temperatures. In one experiment, the present inventors measured a surface temperature of 320° C. during a PECVD process which was later confirmed to have produced particles with an even coating of vertically arranged graphene flakes. This makes the process and device well suited for materials having low melting temperatures, and materials which may be deformed or decompose at higher temperatures. Without wishing to be bound by theory, the inventors speculate that the PECVD enables the carbon source to ionize more readily than only by thermal process.

Without further elaboration, it is believed that a person skilled in the art can, using the present description, including the examples, utilize the present invention to its fullest extent. Also, although the invention has been described herein with regard to its preferred embodiments, which constitute the best mode presently known to the inventors, it should be understood that various changes and modifications as would be obvious to one having the ordinary skill in this art may be made without departing from the scope of the invention which is set forth in the claims appended hereto.

Thus, while various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A production unit for the production of graphene-coated particles, said production unit comprising at least one stationary main chamber (1) and, optionally, a second chamber (2);
   wherein a particle feeder (10), a movable substrate or support (20), a heating element (30), at least one ionized plasma generator (40) and a collecting unit (50) are located in said main chamber (1) and wherein, optionally said collecting unit (50) is movable from the main chamber (1) to said optional, second chamber (2) without compromising the pressure, temperature or gas atmosphere of the main chamber.

2. The production unit according to claim 1, wherein said movable substrate or support (20) is an endless belt.

3. The production unit according to claim 1, wherein said unit comprises a main chamber (1) and a second chamber (2), and wherein said main chamber (1) is equipped with an openable gas-tight closure (53) and said closure is situated downstream of said collecting unit (50), separating said main chamber (1) and said second chamber (2).

* * * * *